United States Patent
Beck et al.

(10) Patent No.: US 8,161,811 B2
(45) Date of Patent: Apr. 24, 2012

(54) FLOW SENSORS HAVING NANOSCALE COATING FOR CORROSION RESISTANCE

(75) Inventors: Scott E. Beck, Murphy, TX (US); Paul P. Bey, Gahanna, OH (US); Jamie Speldrich, Freeport, IL (US); Mohammed A. Javvad Qasimi, Hilliard, OH (US)

(73) Assignee: Honeywell International Inc., Morristown, NJ (US)

( * ) Notice: Subject to any disclaimer, the term of this patent is extended or adjusted under 35 U.S.C. 154(b) by 308 days.

(21) Appl. No.: 12/641,460

(22) Filed: Dec. 18, 2009

(65) Prior Publication Data

US 2011/0146398 A1  Jun. 23, 2011

(51) Int. Cl.
*G01F 1/68* (2006.01)
(52) U.S. Cl. .................. 73/204.26; 73/204.22
(58) Field of Classification Search ............... None
See application file for complete search history.

(56) References Cited

U.S. PATENT DOCUMENTS

| | | | |
|---|---|---|---|
| 3,505,634 A | 4/1970 | Vick | |
| 4,651,564 A | 3/1987 | Johnson et al. | |
| 4,686,764 A | 8/1987 | Adams et al. | |
| 4,732,042 A | 3/1988 | Adams | |
| 4,737,756 A | 4/1988 | Bowman | |
| 4,770,036 A | 9/1988 | Porth et al. | |
| 4,797,166 A | 1/1989 | Von Allmen et al. | |
| 4,880,482 A | 11/1989 | Hashimoto et al. | |
| 4,897,360 A | 1/1990 | Guckel et al. | |
| 4,999,317 A | 3/1991 | Lu et al. | |
| 5,050,429 A | 9/1991 | Nishimoto et al. | |
| 5,062,302 A | 11/1991 | Petersen et al. | |
| 5,095,401 A | 3/1992 | Zavracky et al. | |
| 5,104,848 A | 4/1992 | Miedema et al. | |
| 5,202,572 A | 4/1993 | Kobayashi | |
| 5,549,797 A | 8/1996 | Hashimoto et al. | |
| 5,631,428 A | 5/1997 | Catanescu et al. | |
| 5,801,068 A | 9/1998 | Sooriakumar et al. | |

(Continued)

FOREIGN PATENT DOCUMENTS

DE  440185  1/1927

(Continued)

OTHER PUBLICATIONS

Andersen et al., "Flow and Pressure Sensor Using MEMS Devices in a Cost-Efficient Package," 2 pages, prior to Dec. 18, 2009.

*Primary Examiner* — Harshad Patel
(74) *Attorney, Agent, or Firm* — Seager, Tufte & Wickhem LLC (57) ABSTRACT

A corrosion resistant flow sensor apparatus includes a flow sensor including a micromachinable substrate mounted on a package substrate that includes electrically conductive traces and substrate bond pads. The flow sensor includes a MEMS sensing structure for sensing a mass flow parameter and sensor bond pads coupled to the sensing structure. The sensor bond pads include a top metal layer on a metal diffusion barrier layer including a metal diffusion barrier layer sidewall. Bond wires couple the sensor bond pads to the substrate bond pads. A housing including sides and a top portion is around the flow sensor and includes a flow channel having an inlet and an outlet. A multi-layer corrosion protection coating includes a nm scale adhesion layer and a self assembled monolayer (SAM) is on the adhesion layer. The protection coating covers the sensor bond pads including the metal diffusion barrier layer sidewall.

20 Claims, 5 Drawing Sheets

U.S. PATENT DOCUMENTS

| | | |
|---|---|---|
| 5,936,157 A | 8/1999 | Yamashita et al. |
| 6,030,709 A | 2/2000 | Jensen et al. |
| 6,085,596 A | 7/2000 | Jensen et al. |
| 6,516,785 B1 | 2/2003 | Nakada et al. |
| 6,557,411 B1 | 5/2003 | Yamada et al. |
| 6,626,037 B1 | 9/2003 | Wado et al. |
| 6,675,644 B2 | 1/2004 | Yamakawa et al. |
| 6,889,545 B2 | 5/2005 | Nakada et al. |
| 6,923,053 B2 | 8/2005 | Yamada et al. |
| 7,010,971 B2 | 3/2006 | Matsumoto et al. |
| 7,278,309 B2 | 10/2007 | Dmytriw et al. |
| 7,413,774 B2 | 8/2008 | Kobrin et al. |
| 7,892,488 B2 | 2/2011 | Speldrich et al. |
| 2005/0271893 A1 | 12/2005 | Kobrin et al. |
| 2006/0088666 A1 | 4/2006 | Kobrin et al. |
| 2006/0201425 A1 | 9/2006 | Kobrin et al. |
| 2006/0213441 A1 | 9/2006 | Kobrin et al. |
| 2007/0020392 A1 | 1/2007 | Kobrin et al. |
| 2007/0186648 A1 | 8/2007 | Harmon et al. |
| 2007/0209433 A1 * | 9/2007 | Gehman et al. ............ 73/204.26 |
| 2007/0281492 A1 | 12/2007 | Chinn et al. |
| 2007/0292957 A1 * | 12/2007 | Chua et al. ........................ 436/5 |
| 2008/0081151 A1 | 4/2008 | Kobrin et al. |
| 2008/0083329 A1 | 4/2008 | Kobrin et al. |
| 2008/0206539 A1 | 8/2008 | Kobrin et al. |
| 2008/0241512 A1 | 10/2008 | Boris et al. |
| 2008/0248263 A1 | 10/2008 | Kobrin |
| 2008/0274281 A1 | 11/2008 | Kobrin et al. |
| 2008/0299288 A1 | 12/2008 | Kobrin et al. |

FOREIGN PATENT DOCUMENTS

| | | |
|---|---|---|
| DE | 3606850 | 9/1987 |
| DE | 3814444 | 4/1988 |
| DE | 4216150 | 11/1992 |
| DE | 4402085 | 8/1994 |
| DE | 4415984 | 11/1995 |
| EP | 0537710 | 9/1996 |
| EP | 0588603 | 3/1999 |
| EP | 0548470 | 12/1999 |
| EP | 1534055 | 5/2005 |
| JP | 59231430 | 12/1984 |

* cited by examiner

FIG. 3

FLOW SENSORS HAVING NANOSCALE COATING FOR CORROSION RESISTANCE

FIELD

Disclosed embodiments relate to sensors.

BACKGROUND

Sensor devices are widely used to provide measurements of physical quantities for control and/or monitoring purposes and can include, for example, fluid (gas or liquid) flow sensors. In certain sensing applications, one or more materials arriving at the sensor during sensing can be corrosive.

SUMMARY

Disclosed embodiments described herein include corrosion resistant flow sensor apparatus that include a flow sensor. As used herein, a "flow sensor" sensors at least one mass flow parameter that can comprise an actual fluid flow, or a parameter that is measurable based on the flow of a fluid to a sensing structure (e.g., pressure or force, or coefficient of thermal conductivity). Disclosed flow sensor apparatus comprise flow sensors comprising a micromachinable substrate including a sensing structure that includes sensor bond pads comprising a top metal layer on a metal diffusion barrier layer that includes a metal diffusion barrier layer sidewall. The sensing structure can comprise various sensor types including micro-bridge based sensors and membrane-based sensors.

In one embodiment, the flow sensor is mounted onto the surface of a package substrate and ancillary circuitry separate from the flow sensor (an application specific integrated circuit (ASIC) for signal processing) is also mounted on the package substrate. Bond wires couple bond pads on the flow sensor referred to herein as sensor bond pads to bond pads on the package substrate surface. Disclosed flow sensors include a multi-layer corrosion protection coating comprises a nm scale adhesion layer, nm scale diffusion barrier, and a self assembled monolayer (SAM) that is hydrophobic or hydrophilic that is disposed on the adhesion layer. The multi-layer corrosion protection coating provides corrosion resistance for the flow sensor by covering the sensor bond pads including the metal diffusion barrier layer sidewall, as well as the bond wires. Methods of fabricating disclosed flow sensor apparatus including flow sensors having multi-layer corrosion protection coatings are also disclosed herein.

In an alternate embodiment, one or more sensors can be combined with the ancillary circuitry (e.g., ASIC) on a single die. For example, a flow sensor and ancillary circuitry (e.g., ASIC, passive components) may be integrated together so that they are both on the same die, such as die based on a silicon, insulator or epi coated insulator single substrate.

DETAILED DESCRIPTION

Disclosed embodiments are described with reference to the attached figures, wherein like reference numerals are used throughout the figures to designate similar or equivalent elements. The figures are not drawn to scale and they are provided merely to illustrate the disclosed embodiments. Several aspects disclosed herein are described below with reference to example applications for illustration. It should be understood that numerous specific details, relationships, and methods are set forth to provide a full understanding of the disclosed embodiments and their equivalents. One having ordinary skill in the relevant art, however, will readily recognize that the disclosed embodiments can be practiced without one or more of the specific details or with other methods. In other instances, well-known structures or operations are not shown in detail to avoid obscuring aspects of the disclosed embodiments. Disclosed embodiments are not limited by the illustrated ordering of acts or events, as some acts may occur in different orders and/or concurrently with other acts or events. Furthermore, not all illustrated acts or events are required to implement a methodology in accordance with the disclosed embodiments of their equivalents.

During operation of certain sensors electrochemistry may occur between an exposed electrochemically active layer and another exposed layer on the sensor in the presence of a corrosive fluid that acts as an electrolyte, such as water when one or more electrolytes are present. For example, in one known bond pad arrangement for flow sense die, the bond pads comprise a top metal layer (e.g., gold) on a refractory metal diffusion barrier/adhesion layer (e.g., TiW). The flow sense die generally include a passivation layer that provides a moisture barrier such as a silicon nitride layer that covers the sensing resistor material and metal interconnect lines to provide protection from moisture exposure. However, due to assembly processing needs (e.g., bonding of the sensor to pads onto a PCB), the silicon nitride or other passivation layer does not cover the bond pads so that the Au/TiW bond pad stack is exposed to the ambient being measured.

When the bond pads include at least one oxidizable metal layer, such as a TiW, an electrochemical reaction may occur, particularly at the edge of the refractory metal diffusion barrier layer sidewall of bond pads that are powered during operation of the flow sensor that may result in oxidation of the exposed sidewall of the refractory metal diffusion barrier layer. Such oxidation may result in flaking of the top metal layer of the bond pad that is above the metal diffusion barrier layer. The gold or other top metal layer on the metal diffusion barrier layer as well as the bond wires (e.g., gold bond wires)

may redeposit on the fluid sense die including on lower (applied) potential bond pads, grounded bond pads and interconnects, or the sensing structure (e.g., a micro-bridge). Redeposited metal (e.g., gold from the bond pads or bond wires) may then grow dendritically which can lead to short circuits and other field failures.

Figure 1A:
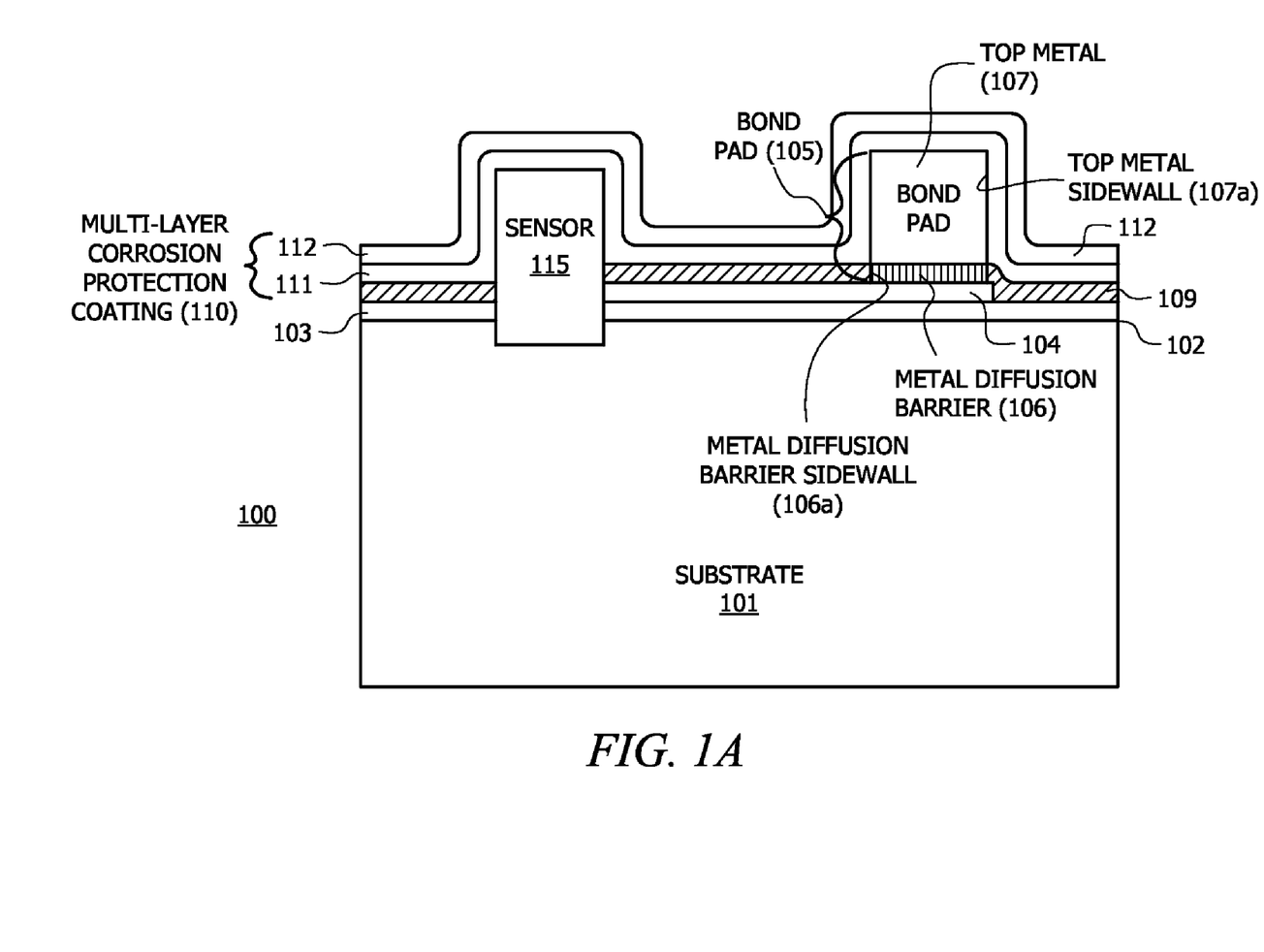
FIG. 1A is a cross sectional depiction of an exemplary flow sensor apparatus embodied as a fluid flow sensor die showing a sensor bond pad having a multi-layer corrosion protection coating thereon comprising a hydrophobic or hydrophilic SAM layer on an adhesion layer, according to a disclosed embodiment.

FIG. 1A is a cross sectional depiction of a flow sensor apparatus embodied as a flow sensor die 100 showing a flow sensing structure 115 and a sensor bond pad 105 having a multi-layer corrosion protection coating 110 thereon, according to a disclosed embodiment. The multi-layer corrosion protection coating 110 is shown comprising a hydrophobic or hydrophilic SAM layer 112 on an adhesion layer 111 on the sensor bond pad 105. As defined herein, a hydrophobic surface is defined as a surface providing a water contact angle >90° at 25° C., while a hydrophilic surface is defined herein as a surface providing a water contact angle <10° at 25° C. A hydrophilic SAM layer 112 may be beneficial for liquid flow sensing, for example. The multi-layer corrosion protection coating 110 is, for example, a dielectric coating, defined herein as having an electrical conductivity at 25° C. of $<10^{-8}$ S/cm. Accordingly, the respective layers in the corrosion protection coating are generally all dielectric layers.

The flow sensor die 100 comprises a micromachinable substrate 101 having a top substrate surface 102. The substrate 101 can comprise a conventional bulk silicon substrate, or other substrates (epi substrates), or in another embodiment a silicon on insulator substrate. In other embodiments, the substrate 101 can comprise other micromachinable substrates including a glass (e.g. quartz) substrate or a ceramic substrate.

The thickness of SAM 112 is generally from 2 Angstroms to 10 nanometers. When SAM layer 112 comprises a hydrophobic surface, hydrophobicity is generally described herein as being provided by a hydrophobic layer, a hydrophobic surface may also be obtained by suitable topography, such as a spiked surface. Embodied as a hydrophobic layer, SAM 112 allows water to roll off of the exposed surfaces of bond pad 105 rather being wetted. The hydrophobic layer SAM, can comprise a fluorocarbon, an organosilane, a fluoroalkylsilanes (e.g., perfluorodecyltrichlorosilane (FDTS), tridecafluoro-1,1,2,2-tetrahydrooctyltrichlorosilane (FOTS), octadecyltricholorsilane (OTS), etc.).

The adhesion layer 111 can comprise materials such as alumina, titania, or silica. In some instances the adhesion layer 111 can also serve as the fluid diffusion barrier layer. The adhesion layer is generally 1 nm to 20 nm thick.

One or more dielectric layer(s) 103 are on the top substrate surface 102. Active circuitry can be formed on the top substrate surface 102 generally comprises circuit elements including transistors, diodes, capacitors, inductors, and resistors (all not shown), as well as metal interconnect and signal lines 104 (e.g., gold, aluminum, or copper lines) on the dielectric layer 103 that interconnect various circuit elements, such as providing the coupling shown between bond pad 105 and sensor 115.

The flow sensor die 100 can include one or more sensor structures 115 including at least one MEMS structure, wherein the sensor structures 115 generally including one or more fluid (e.g., air) flow sensors, pressure sensors (e.g., including a flexible silicon diaphragm with piezoresistors thereon), and/or a temperature sensor. In the case of a pressure sensor, corrosive environments can include acid environments. Other flow sensors that have sense media exposed sensors that may see corrosive materials can benefit from disclosed embodiments. A moisture barrier layer 109, such as comprising silicon nitride, covers the area of the flow sensor die 100 including the metal lines 104. However, as described above, the moisture barrier layer 109 does not cover sensor bond pad 105.

The sensor bond pad 105 shown includes a top metal layer 107 on a metal diffusion barrier layer 106. The bond pad 105 includes sidewalls including a top metal layer sidewall 107(a) and a metal diffusion barrier layer sidewall 106(a). The top metal generally comprises a noble metal or other non-corroding metal, such as gold, while the metal diffusion barrier layer 106 generally comprises a refractory metal comprising material. The thickness of the top metal layer 107 is generally 1 to 1.8 µm, while the thickness of the metal diffusion barrier layer 106 is generally 500 to 1,500 Angstroms. Exemplary refractory metal comprising materials include Ti, TiN, TiW, Ta, TaN, Zr, ZrN, V, Pt, $Cr_2O_3$, and $Ta_2O_5$. The multi-layer corrosion protection coating 110 can be seen to encapsulate the sensor bond pad 105 which thus coats the sidewalls 106(a) of the metal diffusion barrier layer 106 to protect it from corrosion that may otherwise occur upon contact to moisture or other corrosive fluids.

Figure 1B:
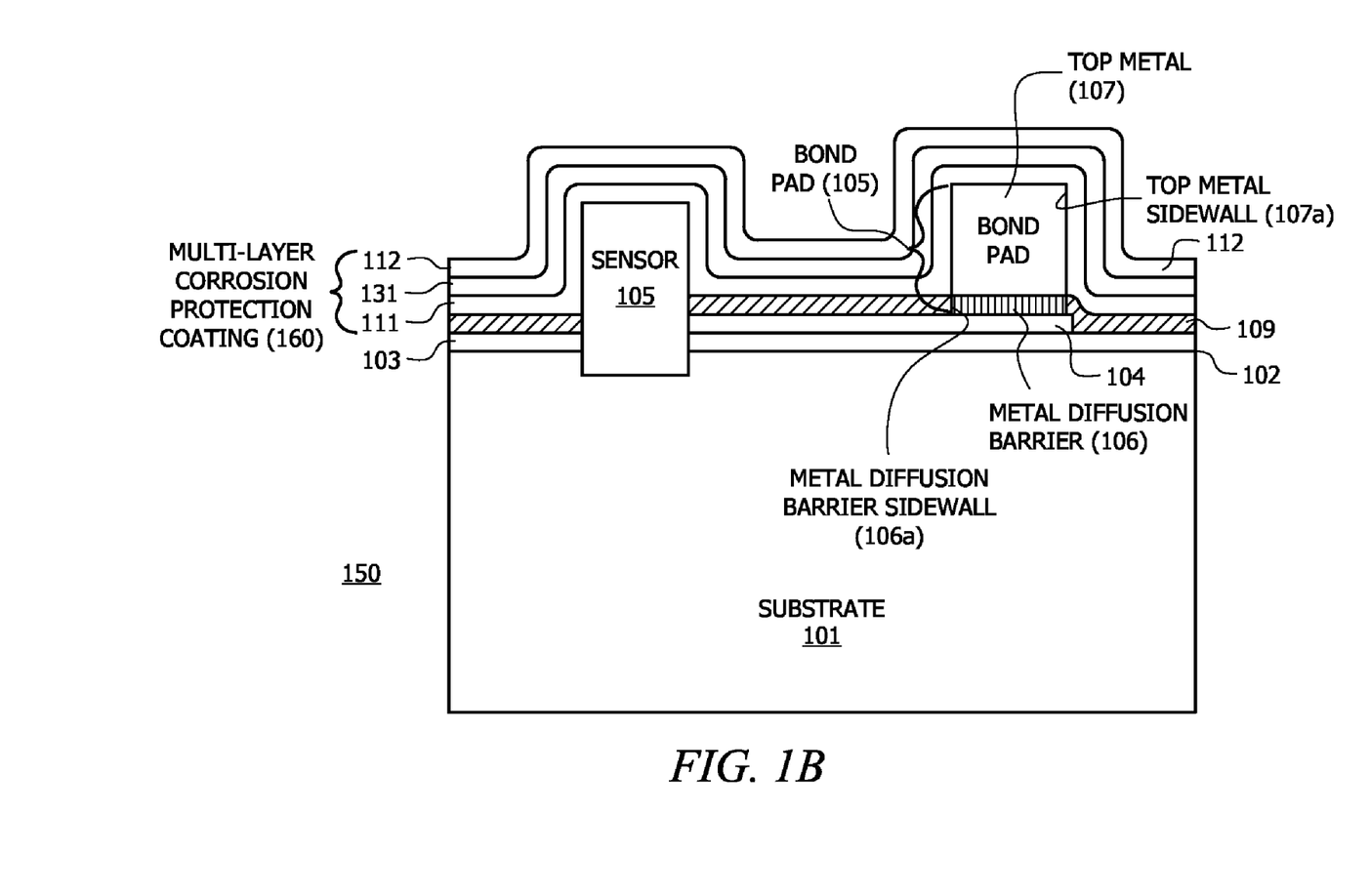
FIG. 1B is a cross sectional depiction of a flow sensor apparatus embodied as a fluid flow sensor die showing a sensors bond pad having a multi-layer corrosion protection coating thereon comprising a hydrophobic or hydrophilic SAM layer, on a diffusion barrier layer, on an adhesion layer, according to a disclosed embodiment.

FIG. 1B is a cross sectional depiction of a flow sensor apparatus embodied as a flow sensor die 150 showing sensor bond pad 105 having a multi-layer corrosion protection coating 160 comprising a SAM layer 112 on a fluid diffusion barrier layer 131, on an adhesion layer 111, according to a disclosed embodiment. Other than having a fluid diffusion barrier layer 131, flow sensor 150 is identical to flow sensor die 100 shown in FIG. 1A. The fluid diffusion barrier layer 131 is generally a dense diffusion barrier layer that will significantly reduce the diffusion of fluids including water molecules to underlying surfaces. The fluid diffusion barrier layer 131 is generally a nanometer thick layer, such as 5 nm to 800 nm thick, and may comprise a silicon oxide, silicon carbide, a silicon nitride, or a silicon oxynitride layer.

Figure 2A:
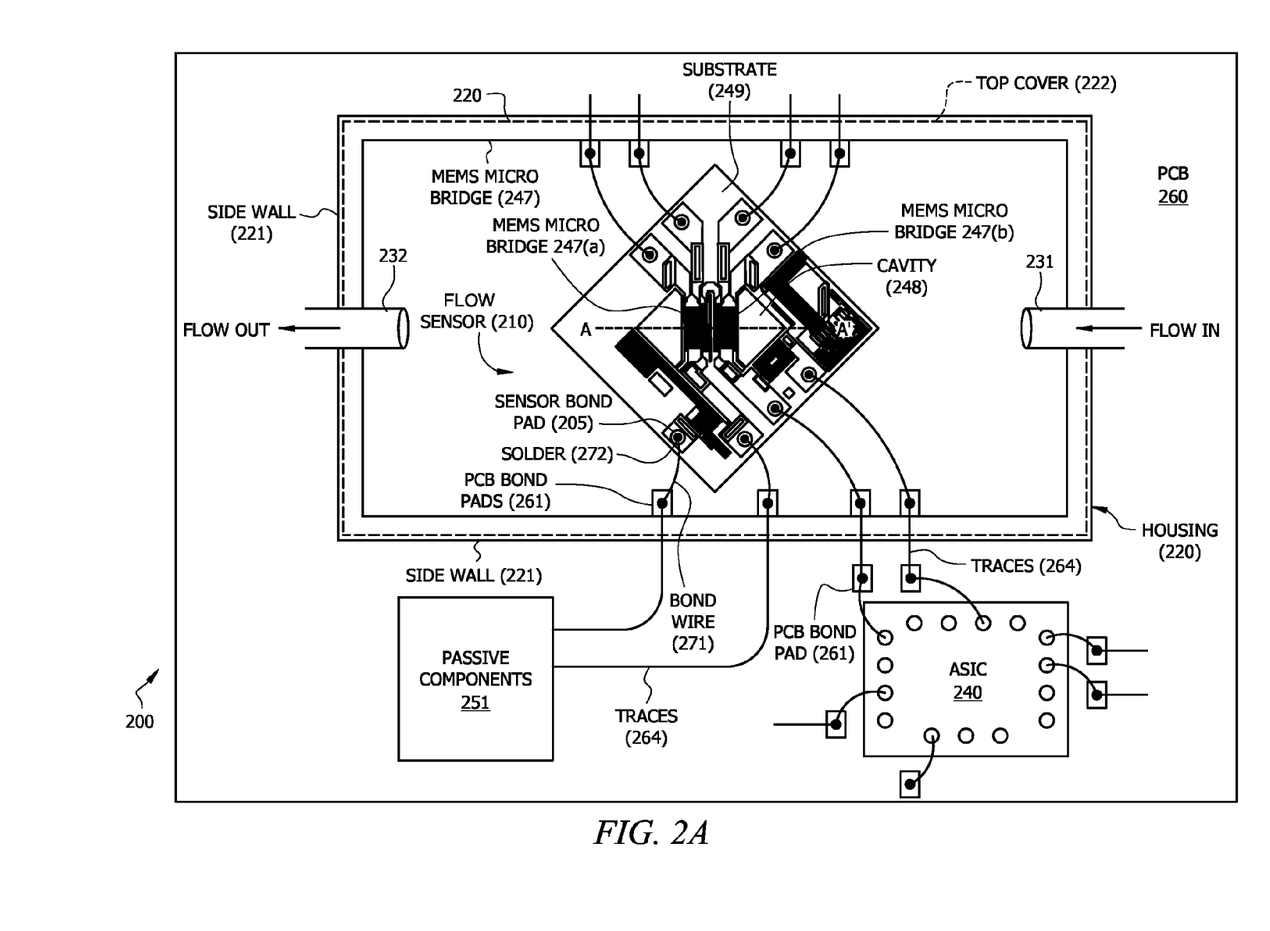
FIG. 2A shows a top view depiction of a corrosion resistant flow sensor apparatus including a MEMS micro-bridge based fluid flow sensor within a housing and a signal processing circuit shown as an ASIC, all on a printed circuit board (PCB), according to a disclosed embodiment.

FIG. 2A shows a top view depiction of a corrosion resistant flow sensor apparatus 200 including a micro-bridge thermal-based flow sensor 210 formed on a micromachinable substrate 249 within a housing 220, and an ASIC 240 all mounted on a package substrate 260 shown as PCB 260, according to a disclosed embodiment. Passive components 251 (e.g., resistors, capacitors and inductors) are also shown on PCB 260. Passive components 251 are not shown connected to the flow sensor 210 directly, and instead will generally either support the ASIC 240 shown in FIG. 2A or will stand-alone in applications without an ASIC. Housing 220 is shown as a rectangular shaped housing includes four (4) side walls 221 and a top cover 222. Housing can be formed from materials including plastic or ceramics, such as by adhesive (epoxy) attachment to the surface of the PCB 260.

An inlet flow tube 231 and an outlet flow tube 232 are shown attached to housing 220 for providing the flow of a medium inside the housing to reach the flow sensor 210 for sensing at least one mass flow parameter (e.g., air flow, pressure), and for providing flow of the medium out of the housing 220, respectively. Flow sensor 210 is shown including a sensing structure 247 comprising a first and a second MEMS micro-bridge 247(a) and 247(b). MEMS micro-bridges 247 (a) and (b) are both formed within cavity region 248.

Flow sensor includes sensor bond pads 205 coupled to MEMS micro-bridges 247(a) and (b). A plurality of bond wires 271 are shown including bond wires for coupling some of the sensor eight (8) sensor bond pads 205 shown on flow sensor 210 to PCB bond pads 261 on the surface of PCB within housing 220. Solder 272 is on the sensor bond pads 205 and substrate bond pads 261 for mediating the joints. PCB 260 also includes electrically conductive traces 264 which provide coupling along the surface of PCB 260, such as for providing coupling between flow sensor 210 and the ASIC 240 which generally includes a signal processor, including connectivity to provide outputs from the respective MEMS micro-bridges 247(a) and (b) to the ASIC 240 for signal processing.

The multi-layer corrosion protection coating 110 shown and described relative to FIGS. 1A and 1B can blanket everything within housing 220 including the surface of the flow sensor 210 as well as bond wires 271. As described above, the coating coats the metal diffusion barrier layer sidewall of the sensor bond pads, which when the bond pads include at least one oxidizable metal layer, helps prevent electrochemical reactions particularly at the edge of the refractory metal diffusion barrier layer sidewall of bond pads during operation of the flow sensor. Coating the metal diffusion barrier layer sidewall of the sensor bond pads thus helps prevent short circuits and other field failures.

Figure 2B:
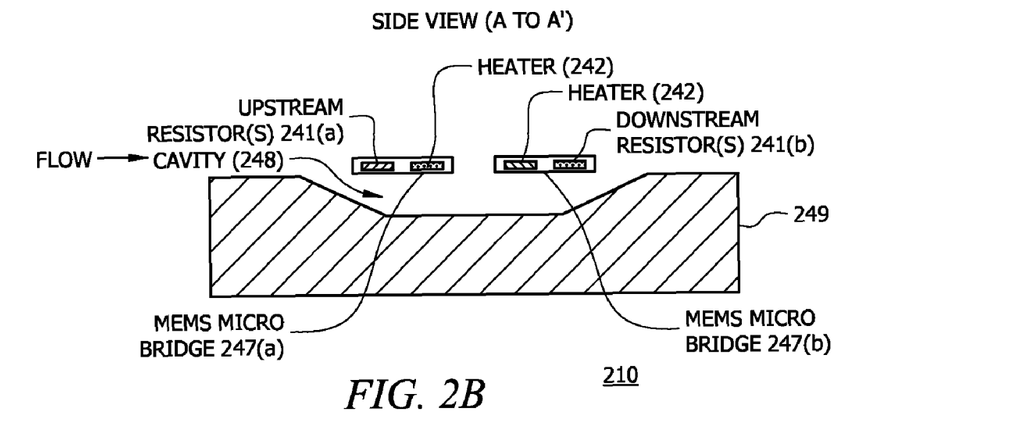
FIG. 2B a side view depiction of the MEMS micro-bridge based flow sensor apparatus shown in FIG. 2A taken along the line A-A' shown in FIG. 2A.

FIG. 2B a side view depiction of the micro-bridge based flow sensor 210 shown in FIG. 2A taken along the line A-A' shown in FIG. 2A. Upstream MEMS micro-bridges 247(a) and downstream MEMS micro-bridge 247(b) are seen to be formed in cavity region 248 of substrate 249 and comprises upstream resistor 241(a) and heater 242, and downstream resistor 241(b) and heater 242, respectively. Heater 242 is thus split between the respective bridges. Although not shown, the resistors can be connected to form a voltage divider, a half bridge or a Wheatstone Bridge (e.g., 4 resistors). In one particular embodiment, the MEMS micro-bridges 247(a) and (b) comprise a combination of sputtered and PECVD silicon nitride.

As described above, the sensing structure can comprise membrane-based sensors. A membrane comprises a series of thin films. The membrane can be made from films such as silicon nitride and silicon oxide, and is generally designed to be thermally isolated from a thermally conductive material, such as silicon in the case of a silicon substrate. For example, for thermal anemometer device (for measuring the wind speed) type flow sensor applications the thermal conductivity of silicon is high enough to pull a significant portion of the heat into the substrate and thus bypass the sense resistors.

Figure 2C:
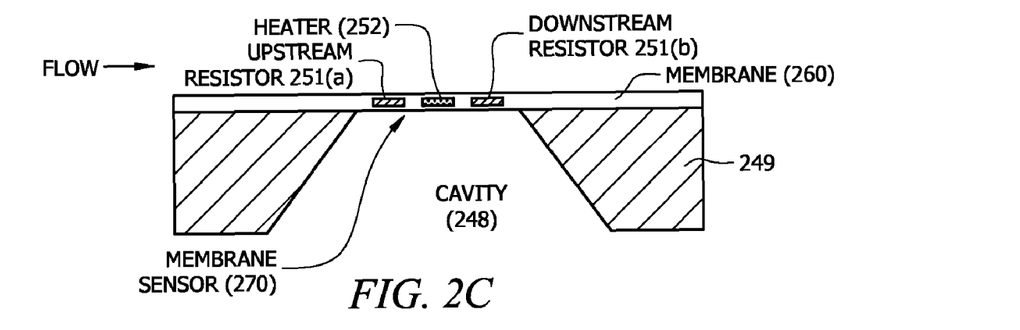
FIG. 2C is a side view depiction of a membrane-based sensor according to a disclosed embodiment.

FIG. 2C is a side view depiction of a membrane-based sensor 270 according to a disclosed embodiment. Membrane-based sensor 270 can be substituted for the MEMS micro-bridges 247(a) and (b) shown in FIGS. 2A and 2B, or in another embodiment combined together with MEMS micro-bridges 247(a) and (b) on a single device. The membrane-based sensor 270 comprises a membrane 260 comprising a thermally insulating membrane film stack (e.g., silicon nitride and silicon oxide) having upstream resistor 251(a), downstream resistor 251(b), and heater 252 therebetween formed thereon. Membrane 260 thermally isolates resistors 251(a) and 251(b) from substrate 249. In embodiments including both a micro-bridge based sensor and a membrane-based sensor, the membrane 260 is generally formed from different materials compared to those used to form the micro-bridge (e.g., silicon).

Figure 3:
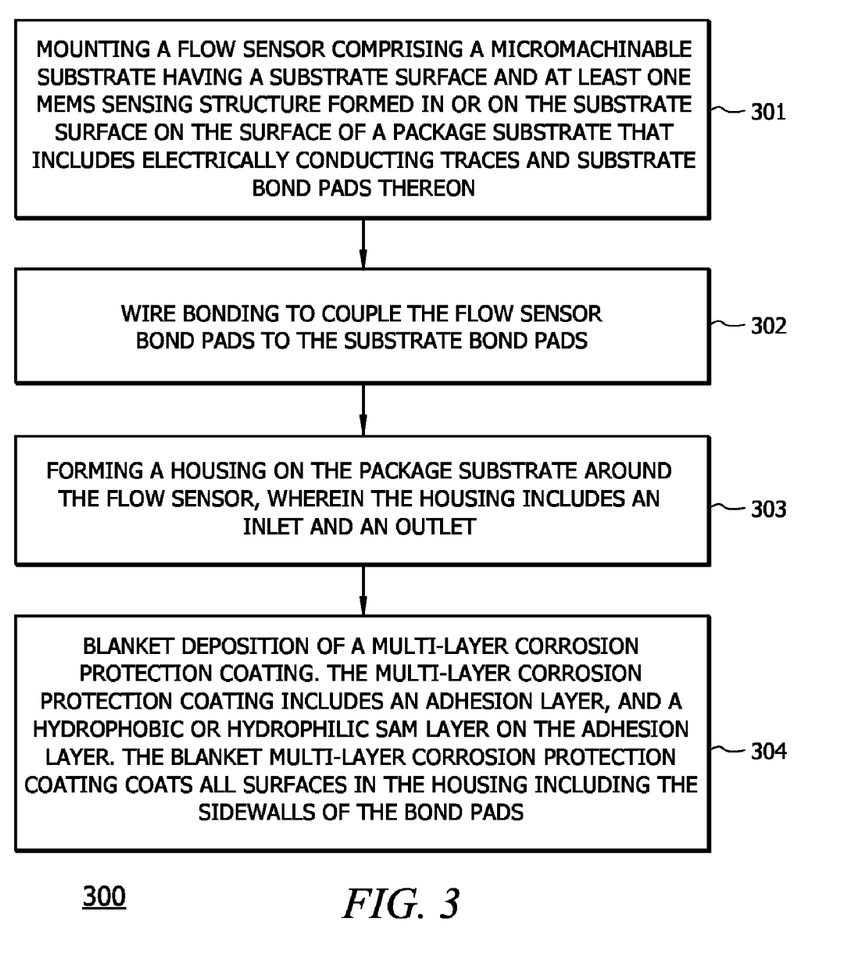
FIG. 3 is a flow chart showing exemplary assembly steps in a method of forming a corrosion resistant flow sensor apparatus comprising a flow sensor including a multi-layer corrosion protection coating thereon within a housing that is coupled to a signal processing circuit.

FIG. 3 is a flow chart showing exemplary assembly steps in a method 300 of forming a corrosion resistant flow sensor apparatus comprising a flow sensor including a multi-layer corrosion protection coating thereon within a housing that is coupled to an ASIC, according to a disclosed embodiment. As described below, since the sensor bond pads are exposed during wire bonding, deposition of the multi-layer corrosion protection coating occurs after wafer fabrication, specifically during assembly, and when the flow sensor comprises a flow sensor die typically after die singulation, die mounting and wire bonding.

Step 301 comprises mounting the flow sensor on the surface of a package substrate that includes electrically conducting traces and substrate bond pads thereon. A signal processing circuit, such as an ASIC, may also be mounted on the surface of a package substrate (e.g., PCB or ceramic). The flow sensor includes a micromachinable substrate having a substrate surface and at least one MEMS sensing structure formed in or on the substrate surface that senses a parameter from a mass flow. The flow sensor includes a plurality of sensor bond pads on the substrate surface comprising a top metal layer on a metal diffusion barrier layer. The plurality of bond pads include a top metal layer and a metal diffusion barrier layer including a metal diffusion barrier layer sidewall, wherein the plurality of sensor bond pads are coupled to the MEMS sensing structure.

In step 302 wire bonding is performed that couples the flow sensor bond pads to the substrate bond pads on the surface of the package substrate. Solder application can be part of the wire bonding process. In a typical embodiment, a signal processing circuit (e.g., ASIC) and passive components are also mounted on the surface of the package substrate and are coupled to the flow sensor by electrically conductive traces and bond wires for coupling the signal processing circuit (e.g., ASIC) as described above. However, as described above, an alternate embodiment, one or more sensors can be combined with the ancillary circuitry (e.g., ASIC) on a single die. In this embodiment a flow sensor and ancillary circuitry (e.g., ASIC) may be integrated together so that they are both on the same die, and are thus coupled to one another by metallization on the die.

Step 303 comprises forming a housing on the package substrate around the flow sensor, wherein the housing includes a pair of flow tubes. In one embodiment the housing can be secured together by epoxy. Step 303 can comprise flow tube attachment to provide an inlet and an outlet to the housing. Various flow tube arrangements can be used, including a single linear flow tube, a 90 degree arrangement, as well as a gun turret arrangement.

Step 304 comprises a blanket (i.e. unmasked) deposition of a multi-layer corrosion protection coating. The depositing of the multi-layer corrosion protection coating can comprise a vapor phase deposition process since such processes coat all surfaces and are not line-of-sight like physical deposition processes such as sputtering. For example, a vapor phase deposition process able to meet the low temperature requirement when the housing comprises plastic includes deposition systems provided by Applied Microstructures, Inc., San Jose, Calif., that provides Molecular Vapor Deposition (MVD®) processes and systems, which allow a deposition temperature ranging from 35 to 150° C. Deposition temperatures of ≦150° C. generally avoids damage to the plastic. The deposition can proceed despite the top being on the housing by a chemical reaction based on reactants entering the housing via the flow tube(s). As described above, the multi-layer corrosion protection coating is generally a nanoscale coating (i.e. <1 μm thick), which allows the multi-layer corrosion protection coating to have a relatively low thermal resistance, which aids temperature sensing that is included in sensor devices such as air flow and some pressure sensors. The blanket multi-layer corrosion protection coating deposition coats all exposed surfaces including all exposed electrical connections.

Step 304(a) comprises depositing an adhesion layer. The adhesion layer is typically 1 nm to 20 nm thick, such as comprising alumina, titania or silica. Atomic layer deposition (ALD) can be used to form the adhesion layer. A source gas precursor for forming alumina can comprise trimethylalumina or aluminum tri-isopropoxide. In the case of silica, tetrachlorosilane and other chlorosilane precursors such a trichlorosilanes, dichlorosilanes can be used as a precursor for silica formation. In addition to chlorosilanes, chlorosiloxanes, fluorosilanes, and fluorosiloxanes may also be used as precursors.

Step 304(*b*) comprises depositing a hydrophobic or hydrophilic SAM layer on the adhesion layer. The thickness of the SAM layer is typically from 2 Angstroms to 10 nm thick. When embodied as a hydrophobic layer, the hydrophobic layer will allow water to roll off the sensor and thus improve reliability of devices in applications including continuous positive airway pressure (CPAP) or bi-level sleep apnea devices and ventilator applications.

Although for some applications, the adhesion layer can also function as the fluid diffusion barrier layer so that a single layer can provide both the adhesion and fluid diffusion barrier functionality, in some embodiments both an adhesion layer and a fluid diffusion barrier layer can be provided. In this embodiment, step 304 includes deposition of both an adhesion layer and a fluid diffusion barrier layer beneath the hydrophobic or hydrophilic SAM, such as described above relative to FIG. 1B. The fluid diffusion barrier layer can then be deposited on the adhesion layer. As described above, the fluid diffusion barrier layer can comprise a silicon oxide, silicon carbide, silicon nitride or silicon oxynitride layer. The fluid diffusion barrier layer can comprise a single material or alternating layers of two or more ultra-thin films of different materials that form a nano-laminate film. The thickness of the fluid diffusion barrier layer is generally 5 nm to 800 nm thick.

Devices that can benefit from disclosed embodiments include medical devices such as respirators, and HVAC/industrial, ventilators, CPAP machines, flow meters, flow controllers, oxygen concentrators. Cytometers, automotive flow sensors, liquid flow sensors, and pressure sensors can also benefit from disclosed embodiments For IC embodiments, the ICs can be formed from semiconductor substrates which may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, disclosed embodiments and their equivalents can be used in a variety of processes including bipolar, CMOS, BiCMOS and MEMS.

While various disclosed embodiments have been described above, it should be understood that they have been presented by way of example only, and not limitation. Numerous changes to the disclosed embodiments can be made in accordance with the disclosure herein without departing from the spirit or scope disclosed herein. Thus, the breadth and scope of the disclosed embodiments should not be limited by any of the above described embodiments. Rather, the scope of the disclosed embodiments should be defined in accordance with the following claims and their equivalents.

Although the disclosed embodiments have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting disclosed embodiments or their equivalents. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which the disclosed embodiments belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention claimed is:

1. A corrosion resistant flow sensor apparatus, comprising:
a package substrate having a package substrate surface including a plurality of substrate bond pads thereon;
at least one flow sensor die comprising silicon mounted on said package substrate surface including a sensing structure for sensing a mass flow parameter from a medium flowing over said sensing structure and a plurality of sensor bond pads coupled to said sensing structure for providing a sensing signal, wherein said sensor bond pads comprise a top metal layer disposed on a metal diffusion barrier layer including a metal diffusion barrier layer sidewall;
bond wires for coupling said plurality of sensor bond pads to said substrate bond pads;
a housing comprising plastic formed around said sensor die and said sensor bond wires comprising sides and a top portion, wherein said housing includes a flow channel having an inlet for providing said medium flowing over said sensing structure and an outlet;
a multi-layer corrosion protection coating comprising a nanometer-scale adhesion layer and a self assembled monolayer (SAM) that is hydrophobic or hydrophilic disposed on said adhesion layer, wherein said multi-layer corrosion protection coats said sensor bond pads including over said metal diffusion barrier layer sidewall and coats said sensor bond wires, and
a signal processing circuit on said substrate surface that receives and processes said sensing signal from said sensing structure.

2. The flow sensor apparatus of claim 1, wherein said package substrate comprises a printed circuit board (PCB).

3. The flow sensor apparatus of claim 1, wherein said SAM comprises a hydrophobic layer.

4. The flow sensor apparatus of claim 3, wherein said flow sensor comprises an airflow sensor, and said sensing structure comprises a MEMS micro-bridge.

5. The flow sensor apparatus of claim 1, wherein said SAM has a thickness from 2 Angstroms to 10 nanometers.

6. The flow sensor apparatus of claim 1, wherein a multi-layer corrosion protection coating is a dielectric coating.

7. A corrosion resistant flow sensor apparatus, comprising:
a package substrate having a package substrate surface including a plurality of electrically conductive traces and substrate bond pads thereon;
at least one flow sensor comprising a micromachinable substrate mounted on said package substrate surface including a sensing structure for sensing a mass flow parameter from a medium flowing over said sensing structure and a plurality of sensor bond pads coupled to said sensing structure for providing a sensing signal, wherein said sensor bond pads comprise a top metal layer disposed on a metal diffusion barrier layer including a metal diffusion barrier layer sidewall;

bond wires coupling said plurality of sensor bond pads to said substrate bond pads;

a housing formed around said flow sensor and said sensor bond wires comprising sides and a top portion, said housing including a flow channel having an inlet for providing said medium flowing over said sensing structure and an outlet, and a multi-layer corrosion protection coating comprising a nanometer-scale adhesion layer and a self assembled monolayer (SAM) that is hydrophobic or hydrophilic disposed on said adhesion layer, wherein said multi-layer corrosion protection coating covers sensor bond pads including over said metal diffusion barrier layer sidewall and covers said bond wires.

8. The flow sensor apparatus of claim 7, wherein said package substrate comprises a PCB and said micromachinable substrate comprises silicon.

9. The flow sensor apparatus of claim 7, wherein said micromachinable substrate comprises glass or quartz.

10. The flow sensor apparatus of claim 7, further comprising a signal processing circuit on said package substrate surface coupled to said sensor bond pads by said plurality of electrically conductive traces to receive and process said sensing signal from said sensing structure.

11. The flow sensor apparatus of claim 7, wherein said top metal layer comprises gold and said metal diffusion barrier layer comprises a refractory metal.

12. The flow sensor apparatus of claim 7, wherein said housing comprises a plastic.

13. The flow sensor apparatus of claim 7, wherein said flow sensor comprises an airflow sensor, and said sensing structure comprises a MEMS micro-bridge.

14. The flow sensor apparatus of claim 7, wherein said flow sensor comprises a membrane-based sensor.

15. The flow sensor apparatus of claim 7, wherein said multi-layer corrosion protection coating further comprises a fluid diffusion layer different from said adhesion layer between said adhesion layer and said SAM.

16. The flow sensor apparatus of claim 15, wherein said adhesion layer comprises alumina, titania or silica.

17. The flow sensor apparatus of claim 16, wherein said fluid diffusion barrier layer is a nanometer thick layer and comprises a silicon oxide, silicon carbide, silicon nitride, or a silicon oxynitride layer.

18. The flow sensor apparatus of claim 7, wherein SAM has a thickness from 2 Angstroms to 10 nanometers.

19. The flow sensor apparatus of claim 7, wherein said metal diffusion barrier layer comprises Ti, TiN, TiW, Ta, TaN, Zr, ZrN, V, Pt, $Cr_2O_3$, $Ta_2O_5$ or combinations thereof.

20. The flow sensor apparatus of claim 7, wherein said multi-layer corrosion protection coating is a dielectric coating.

* * * * *